(12) United States Patent
Desu (10) Patent No.: US 11,133,464 B2
(45) Date of Patent: Sep. 28, 2021

(54) CONDUCTIVE AMORPHOUS OXIDE CONTACT LAYERS

(71) Applicant: 4DS MEMORY, LIMITED, West Perth (AU)

(72) Inventor: Seshubabu Desu, Fremont, CA (US)

(73) Assignee: 4DS MEMORY, LIMITED, West Perth (AU)

( * ) Notice: Subject to any disclaimer, the term of this patent is extended or adjusted under 35 U.S.C. 154(b) by 0 days.

(21) Appl. No.: 16/546,029

(22) Filed: Aug. 20, 2019

(65) Prior Publication Data

US 2021/0057646 A1   Feb. 25, 2021

(51) Int. Cl.
*H01L 45/00* (2006.01)
*H01L 27/24* (2006.01)

(52) U.S. Cl.
CPC ........ *H01L 45/147* (2013.01); *H01L 27/2436* (2013.01); *H01L 45/1206* (2013.01); *H01L 45/1253* (2013.01)

(58) Field of Classification Search
CPC ............... H01L 27/2436; H01L 45/147; H01L 45/1206; H01L 45/1253
USPC .......................................................... 257/4
See application file for complete search history.

(56) References Cited

U.S. PATENT DOCUMENTS

| | | | | |
|---|---|---|---|---|
| 2003/0184952 | A1* | 10/2003 | Baniecki | H01G 4/008 361/311 |
| 2009/0230391 | A1* | 9/2009 | Noshiro | H01L 45/1608 257/43 |
| 2012/0181659 | A1* | 7/2012 | Wang | H01L 28/56 257/532 |
| 2016/0154178 | A1* | 6/2016 | Jaeger | H01L 27/288 385/14 |
| 2017/0288140 | A1* | 10/2017 | Karpov | H01L 27/2481 |
| 2018/0219154 | A1* | 8/2018 | Majhi | H01L 45/16 |

OTHER PUBLICATIONS

Direct Deposition of Amorphous Cobalt-Vanadium Mixed Oxide Films for Electrocatalytic Water Oxidation Muhammad Ali Ehsan Muhammad Ali Ehsan ACS Omega 2019, 4, 7, 12671-12679, Jul. 25, 2019, https://doi.org/10.1021/acsomega.9b01385 (Year: 2019).*

* cited by examiner

*Primary Examiner* — Igwe U Anya
(74) *Attorney, Agent, or Firm* — Kilpatrick Townsend & Stockton LLP (57) ABSTRACT

An electronic device is disclosed. The electronic device includes a conductor, and a conductive oxide material electrically connected to the conductor. The conductive oxide materials is substantially amorphous, and the conductive oxide material includes first and second oxide materials. In addition, the first oxide material is different from the second oxide material. The electronic device also includes a second material, electrically connected to the conductive oxide material.

24 Claims, 5 Drawing Sheets

CONDUCTIVE AMORPHOUS OXIDE CONTACT LAYERS

FIELD OF THE INVENTION

The present application generally pertains to conductive amorphous oxide layers, and more particularly to conductive amorphous oxide layers having multiple oxide constituents.

BACKGROUND OF THE INVENTION

For various applications, materials having electrical, mechanical, chemical, and other properties are used with varying degrees of costs and benefits. Oxide materials have numerous benefits and are ubiquitous in may applications. Electrically conductive oxide materials having an amorphous or nearly amorphous structure are needed.

BRIEF SUMMARY OF THE INVENTION

One inventive aspect is an electronic device. The electronic device includes a conductor, and a conductive oxide material electrically connected to the conductor. The conductive oxide materials is substantially amorphous, and the conductive oxide material includes first and second oxide materials. In addition, the first oxide material is different from the second oxide material. The electronic device also includes a second material, electrically connected to the conductive oxide material.

In some embodiments, the first oxide material is conductive, and the second oxide material is conductive.

In some embodiments, the first oxide material includes an oxide of a noble metal and the second oxide material includes an oxide of a transition metal.

In some embodiments, the first oxide material has a first crystalline lattice structure and the second oxide material as a second crystalline lattice structure, where the first and second crystalline lattice structures are different.

In some embodiments, the conductive oxide material has a diffusion constant of oxygen ions less than about 1×10−10 cm2/s.

In some embodiments, the conductive oxide material does not donate oxygen ions to the second material, and the conductive oxide material does not accept oxygen ions from the second material.

In some embodiments, the conductive oxide material is substantially transparent.

In some embodiments, the conductive oxide material and the second material form an ohmic contact therebetween.

In some embodiments, the conductive oxide material and the second material form a Schottky contact therebetween.

In some embodiments, the conductive oxide material and the conductor form an ohmic contact therebetween.

In some embodiments, the conductive oxide material and the conductor form a Schottky contact therebetween.

In some embodiments, the conductive oxide material and the second material at least partly form an access device of a memory cell.

Another inventive aspect is a method of forming an electronic device. The method includes connecting a conductive oxide material electrically to a conductor, where the conductive oxide materials is substantially amorphous, and where the conductive oxide material includes first and second different oxide materials. The method also includes connecting a second material to the conductive oxide material.

In some embodiments, the first oxide material is conductive, and the second oxide material is conductive.

In some embodiments, the first oxide material includes an oxide of a noble metal and the second oxide material includes an oxide of a transition metal.

In some embodiments, the first oxide material has a first crystalline lattice structure and the second oxide material as a second crystalline lattice structure, where the first and second crystalline lattice structures are different.

In some embodiments, the conductive oxide material has a diffusion constant of oxygen ions less than about 1×10−10 cm2/s.

In some embodiments, the conductive oxide material does not donate oxygen ions to the second material, and the conductive oxide material does not accept oxygen ions from the second material.

In some embodiments, the conductive oxide material is substantially transparent.

In some embodiments, the conductive oxide material and the second material form an ohmic contact therebetween.

In some embodiments, the conductive oxide material and the second material form a Schottky contact therebetween.

In some embodiments, the conductive oxide material and the conductor form an ohmic contact therebetween.

In some embodiments, the conductive oxide material and the conductor form a Schottky contact therebetween.

In some embodiments, the conductive oxide material and the second material at least partly form an access device of a memory cell.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Certain oxide materials and their characteristics and attributes are discussed below. In addition, certain applications of the oxide materials are described below. Neither the materials nor the applications thereof are to be limited by this disclosure, as various alternative materials and applications may be made by those of ordinary skill in the art in light of and using the features discussed in this disclosure.

The oxide materials discussed herein have an amorphous structure formed by at least two different oxides AOx and BOx, where A and B are elements or groups. One or both of AOx and BOx may be crystalline, however, the composite material AOxBOx is a nano level mixture, not a compound, and is amorphous or nearly amorphous or substantially amorphous.

For example, in some embodiments, any crystal grains formed by individual constituents AOx and BOx are small enough that the substantive effect of the composite material AOxBOx in its application is as if the composite material AOxBOx were amorphous. For example, the composite material AOxBOx may have substantially no ionic conductivity. In some embodiments, the grains of the individual constituents AOx and BOx may be less than about 10 nm, about 9 nm, about 8 nm, about 7 nm, about 6 nm, about 5 nm, about 4 nm, about 3 nm, about 2 nm, about 1 nm, about 0.9 nm, about 0.8 nm, about 0.7 nm, about 0.6 nm, about 0.5 nm, about 0.4 nm, or about 0.3 nm.

Alternatively or additionally, crystal structures of the individual constituents AOx and BOx may be different. Consequently, adjacent grains of individual constituents AOx and BOx do not and cannot form a continuous lattice crystalline structure across their mutual boundary.

Alternatively or additionally, the individual constituents AOx and BOx are mutually insoluble. Therefore, the individual grains of the AOx and BOx constituents contact one another without intermixing.

At least partly because of these properties, when the oxide materials discussed herein are deposited on a substrate, for example with a sputtering process, separate phases of the composite material AOxBOx do not or substantially do not form.

A and B elements may, for example, include Ru, Rh, Pd, Re, Ir, Pt, or other noble metals, as understood by those of skill in the art. For example, some other metals having low affinity for oxygen as compared to yet other metals are considered noble metals by those of skill in the art. A and B elements may, for example, include Ti, Zr, Hf, Nb, Ta, Si, Al, Ga, or other transition metals, as understood by those of skill in the art. For example, some other elements are considered transition metals by those of skill in the art. In some embodiments, other elements or groups are used to form the AOx or BOx constituents. For example, other similar elements or groups are used to form the AOx or BOx constituents.

In some embodiments, the AOx and BOx constituents are both conductive. In some embodiments, one of the AOx and BOx constituents is conductive. In such embodiments, the conductive constituent forms conductive one or more paths through the AOxBOx composite material.

All combinations of the AOx and BOx individual constituents are contemplated and included herein as embodiments of the composite material AOxBOx. In addition, composite materials AOxBOx having any combination of the properties discussed herein are contemplated and included herein as embodiments.

In some embodiments, the AOxBOx composite material is conductive or substantially conductive. For example, the AOxBOx composite material may have resistivity less than $1\times10^{-3}$ Ohm-cm.

In some embodiments, the AOxBOx composite material is transparent or substantially transparent to a bandwidth of electromagnetic radiation. For example, the AOxBOx composite material may absorb less than 10% of visible light transmitted therethrough.

In some embodiments, the AOxBOx composite material is opaque or substantially opaque to a bandwidth of electromagnetic radiation.

In some embodiments, the AOxBOx composite material is fully oxidized or substantially fully oxidized. Accordingly, when in contact with another material the AOxBOx composite material does not donate to or accept oxygen ions from the other material. For example, the amount, if any, of oxygen ions which migrate from the other material to the AOxBOx composite material causes no substantial difference in one or more of the electrical, mechanical, and chemical behavior of the other material.

In some embodiments, the AOxBOx composite material prevents or substantially prevents oxygen ion conduction therethrough. For example, the diffusion constant of oxygen ions may be less than about $1\times10^{-10}$ cm$^2$/s, less than about $1\times10^{-11}$ cm$^2$/s, or less than about $1\times10^{-12}$ cm$^2$/s.

In some embodiments, the AOxBOx composite material may be deposited on a substrate at temperatures sufficiently low that the material does not chemically react with the substrate. For example, the AOxBOx composite material may be deposited at room temperature or at about room temperature.

Accordingly, in some embodiments, when the AOxBOx composite material is deposited, the AOxBOx composite material does not donate or accept oxygen to or from the substrate material. As a result, the properties of the substrate material significant for the application, as understood by those of skill in the art, are not altered by the presence, proximity, or contact of the AOxBOx composite material. For example, the amount, if any, of oxygen ions which migrate to or from the substrate material from or to the AOxBOx composite material causes no substantial difference in one or more of the electrical, mechanical, and chemical behavior of the substrate material or of the AOxBOx composite material. In some embodiments, no or substantially no transition layer is formed.

In some embodiments, the AOxBOx composite material may be deposited on a substrate with a reactive sputtering process. A single target comprising both A and B elements or groups may be used in an atmosphere comprising oxygen. Alternatively, a first target comprising the A element or group and a second target comprising the B element or group may be used in the atmosphere comprising oxygen.

The temperature during the deposition may be, for example, about room temperature. Higher temperatures may also be used. For example, temperatures less than about 50 C, about 100 C, about 150 C, about 200 C, about 250 C, or about 300 C may be used.

The deposition pressure may be, for example, about 0.1 m Torr, about 10 m Torr, or between about 0.1 m Torr and about 10 m Torr.

During the deposition, the oxygen partial pressure may be, for example, about 2%, about 20%, or between about 2% and about 20%.

During the deposition, the RF power may be, for example, about 0.1 W/cm$^2$, about 10 W/cm$^2$, or between about 0.1 W/cm$^2$ and about 10 W/cm$^2$.

Other deposition processes may be used, as understood by those of skill in the art. For example, any of the following processes may be used: Pulsed Laser deposition, Chemical Vapor deposition, Molecular Beam Epitaxy deposition, and Atomic Layer deposition. In some embodiments, solution deposition techniques may be used, such as Sol-gel and Metal-Organic deposition. As understood by those of ordinary skill in the art, other deposition techniques may be used.

In some applications, an AOxBOx material is formed on a substrate to create an electrical contact between the AOxBOx material and the substrate material. In some embodiments, the contact is Ohmic or substantially Ohmic. In some embodiments, the contact forms a Schottky barrier. As understood by those of skill in the art, the A and B elements or groups used for the AOxBOx material, the specific constitution of the AOxBOx material, and the material of the substrate determine whether the contact is Ohmic, substantially Ohmic, or forms a Schottky barrier.

Figure 1:
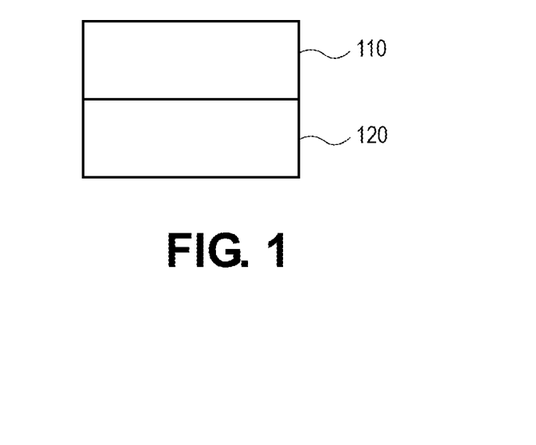
FIG. 1 is a schematic diagram of an ohmic contact between an oxide and a conductive amorphous oxide material.

FIG. 1 is a schematic diagram of an ohmic contact between a material 120 and a conductive amorphous AOxBOx material 110. The contact between material 120 and AOxBOx material 110 forms an ohmic contact having properties of ohmic contacts, as understood by those of skill in the art. FIG. 1 illustrates an embodiment of a particular application of a contact formed with AOxBOx materials. Numerous other applications are also contemplated. Some, but not all of these other applications are discussed elsewhere herein.

For example, the ohmic contact may have current vs. voltage linearity properties identifiable by one of skill in the art as being characteristic of an ohmic contact. In some embodiments, the ohmic contact is non-rectifying, and may be characterized by a linear or substantially linear current vs. voltage curve. The ohmic contact may have low resistivity. For example, the contact may have a contact resistance which is less than about 1e-11 Ohm m$^2$, about 1e-12 Ohm m$^2$, about 1e-13 Ohm m$^2$, or about 1e-14 Ohm m$^2$. The contact, may, for example, be identified as being ohmic by one of skill in the art as a result of parameters of the material 120 and AOxBOx material 110, such as Fermi level being substantially equal.

In any embodiment or application, a noble metal layer may be formed between the material 120 and the AOxBOx material 110. In such embodiments or applications, a first ohmic contact may be formed between the AOxBOx material 110 and the noble metal layer. Additionally or alternatively, a second ohmic contact may be formed between the material 120 and the noble metal layer.

The material 120 may, for example, comprise a conductive oxide. For example, material 120 may comprise one or more of: $InO_x$, $ZnO$, $GaO_x$, $SnO_x$, $(InGa)O_x$, $(ZnGa)O_x$, $(InZnGa)O_x$, $BaSnO_3$, and ITO, as understood by those of skill in the art. Other conductive oxides, as understood by those of skill in the art, may be used.

The material 120 may comprise a semiconductor or semiconducting oxide, for example, having a conductivity which may be electrically, chemically, or mechanically controlled or modified, as understood by those of skill in the art. For example, material 120 may comprise one or more of: $InO_x$, $ZnO$, $GaO_x$, $SnO_x$, $(InGa)O_x$, $(ZnGa)O_x$, $(InZnGa)O_x$, GaN, AlN as understood by those of skill in the art. Other semiconductors and semiconductor oxides, as understood by those of skill in the art, may be used.

The material 120 may comprise an insulative oxide. For example, material 120 may comprise one or more of: $ZrO_2$, doped $ZrO_2$, $BaTiO_3$, $SrTiO_3$, as understood by those of skill in the art. Other insulative oxides, as understood by those of skill in the art, may be used.

The material 120 may comprise a non-oxide conductive metal material. For example, material 120 may comprise one or more of: Al, Pt, Cu, Au, Ag, W, Ti, and Ta, as understood by those of skill in the art. Other non-oxide conductive metal materials, as understood by those of skill in the art, may be used.

The material 120 may comprise a non-oxide conductive noble metal material. For example, material 120 may comprise one or more of: Ru, Rh, Pd, Ag, Os, Ir, Pt, and Au, as understood by those of skill in the art. Other non-oxide conductive noble metal materials, as understood by those of skill in the art, may be used.

The material 120 may comprise another non-oxide conductive material. For example, material 120 may comprise one or more of: TiN, TaN, TiAlNx, and TaAlNx, as understood by those of skill in the art. Other non-oxide conductive materials, as understood by those of skill in the art, may be used.

The material 120 may comprise a oxide or non-oxide semiconductor material, for example, having a conductivity which may be electrically, chemically, or mechanically controlled or modified, as understood by those of skill in the art. For example, material 120 may comprise one or more of: or $(PrCa)MnO_3$, $(Sm1-xCax)MnO_3$, and $(La1-xSrx)MnO_3$, GaN, AlN as understood by those of skill in the art. Other non-oxide semiconductor materials, as understood by those of skill in the art, may be used.

The material 120 may comprise a non-oxide insulative material. For example, material 120 may comprise one or more of: $SiO_2$, and $Ta_2O_5$, as understood by those of skill in the art. Other non-oxide insulative materials, as understood by those of skill in the art, may be used.

Material 120 may be a single material, multiple materials, or may be a solid solution of multiple materials.

The AOxBOx material 110 may have any of the properties of the AOxBOx materials discussed elsewhere herein.

Figure 2:
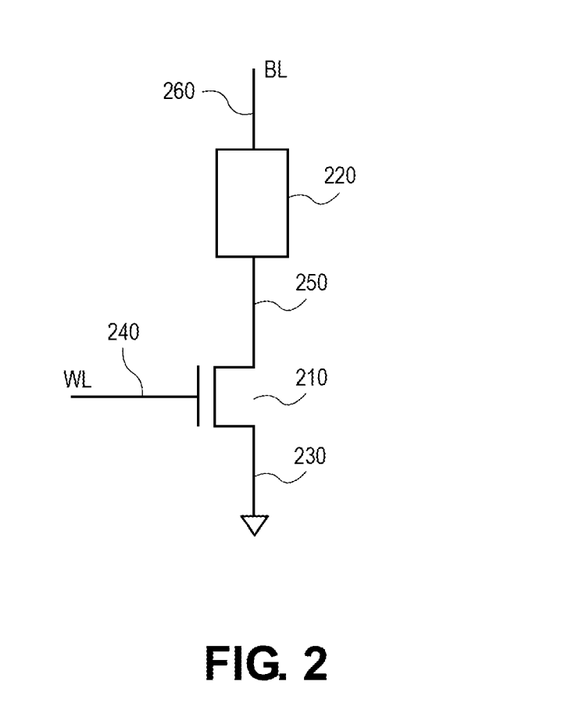
FIG. 2 is a schematic diagram of a transistor access device connected to a memory cell.

FIG. 2 is a schematic diagram of a transistor access device 210 connected to a memory cell 220 of a memory device. FIG. 2 illustrates an embodiment of a particular application of a contact formed with AOxBOx materials. Numerous other applications are also contemplated. Some, but not all of these other applications are discussed elsewhere herein.

In this embodiment, access device 210 is connected to a ground potential by a first AOxBOx contact structure 230, is connected to a word line of the memory device by a second AOxBOx contact structure 240, and is connected to the memory cell 220 by a third AOxBOx contact structure 250. In addition, the memory cell 220 is connected to a bit line of the memory device by a fourth AOxBOx contact structure 260.

Figure 3:
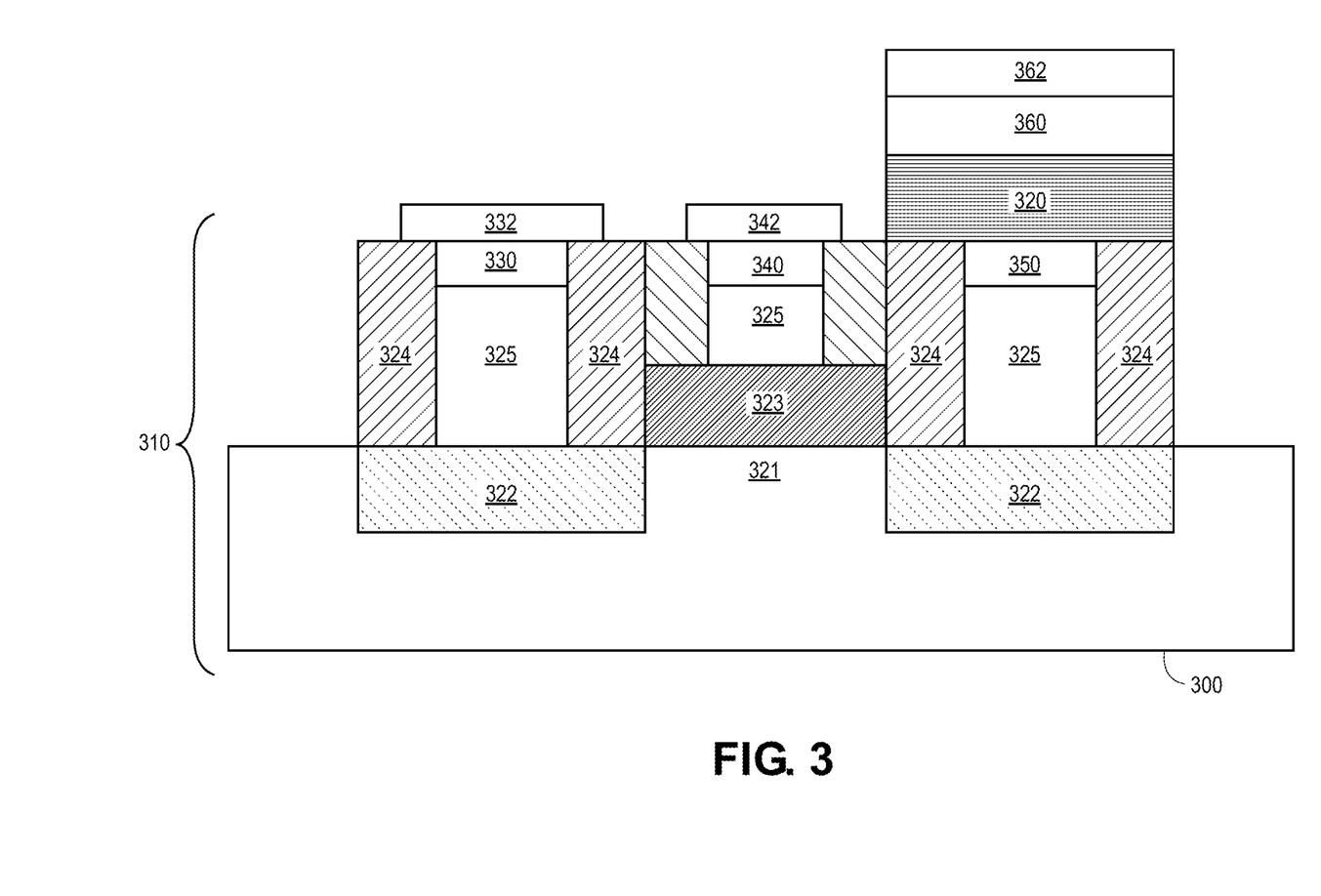
FIG. 3 is a schematic diagram of a transistor access device connected to a memory cell.

FIG. 3 is a schematic cross-sectional diagram of a transistor access device 310 connected to a memory cell 320, such as that illustrate in FIG. 2. FIG. 3 illustrates an embodiment of a particular application of a contact formed with AOxBOx materials. Numerous other applications are also contemplated. Some, but not all of these other applications are discussed elsewhere herein.

Access device 310 includes substrate 300, drain and source 322, and gate 323, which, for example, may include a gate oxide and a conductor. The conductor may comprise any conductive material listed herein or as understood by those of skill in the art. The drain and source 322 may comprise any conductive or semiconductive material listed herein or as understood by those of skill in the art. In some embodiments, the drain and source 322 are semiconductor oxides.

In this embodiment, access device 310 includes plug contacts 325 which are separated by insulators 324. Plug contacts 325 may, for example, comprise tungsten (W). As understood by those of skill in the art, other plug contact materials may be used.

The source 322 of access device 310 is connected to a ground potential conductor 332 through source plug contact 325 by a first AOxBOx contact structure 330. Conductor 332 may comprise any conductive material listed herein or as understood by those of skill in the art. AOxBOx contact structure 330 may have any of the properties of the AOxBOx materials discussed elsewhere herein. AOxBOx contact structure 330 may form an ohmic contact with the source plug contact 325 connected thereto. Additionally or alternatively, AOxBOx contact structure 330 may form an ohmic contact with the conductor 332.

In alternative embodiments, source plug contact 325 is omitted. In such embodiments, AOxBOx contact structure 330 forms a contact with the source 322. The contact between AOxBOx contact structure 330 and the source 322 may be ohmic. In some embodiments, source 322 is formed of an oxide material, such as a semiconductor oxide material.

The gate 323 of access device 310 is connected to a gate conductor 342 through gate plug contact 325 by a second AOxBOx contact structure 340. Conductor 342 may comprise any conductive material listed herein or as understood by those of skill in the art. AOxBOx contact structure 340 may have any of the properties of the AOxBOx materials discussed elsewhere herein. AOxBOx contact structure 340 may form an ohmic contact with the gate plug contact 325 connected thereto. Additionally or alternatively, AOxBOx contact structure 340 may form an ohmic contact with the conductor 342.

In alternative embodiments, gate plug contact 325 is omitted. In such embodiments, AOxBOx contact structure 340 forms a contact with the conductor of the gate 323. The contact between AOxBOx contact structure 340 and the conductor of the gate 323 may be ohmic. In some embodiments, the conductor of the gate 323 is formed of an oxide material, such as a semiconductor oxide material.

In alternative embodiments, gate plug contact 325 and gate 323 are omitted. In such embodiments, AOxBOx contact structure 340 forms a contact with the channel portion 321 of access device 310. The contact between AOxBOx contact structure 340 and the channel portion 321 may be a Schottky barrier contact, having characteristics similar or identical to those of any of the Schottky barriers or Schottky diodes discussed elsewhere herein. The Schottky barrier contact may form a Schottky diode having a polarity or orientation such that a voltage placed across the AOxBOx contact structure 340 and source 322 which causes the channel portion 321 to conduct also causes the Schottky diode to be reverse biased.

The drain 322 of access device 310 is connected to the memory cell 320 through drain plug contact 325 by a third AOxBOx contact structure 350. AOxBOx contact structure 350 may have any of the properties of the AOxBOx materials discussed elsewhere herein. AOxBOx contact structure 350 may form an ohmic contact with the drain plug contact 325 connected thereto. Additionally or alternatively, AOxBOx contact structure 350 may form an ohmic contact with the memory cell 320.

Memory cell 320 may comprise a memory layer material, such as PCMO, or another memory layer material and an electrode layer, as understood by those of skill in the art. The electrode layer may, for example, comprise tungsten, and may cooperatively form a metal oxide heterojunction memory with the memory layer material. The electrode layer may be configured to accept or donate oxygen ions or vacancies from or to memory layer material in response to an electric field applied across the electrode layer and the memory layer material. In some embodiments, the electrode layer may be oxygen-rich and may cooperatively form an oxygen ion heterojunction memory cell with memory layer material. In alternative embodiments, the electrode layer may be oxygen depleted and may cooperatively form an oxygen vacancy heterojunction memory cell with the memory layer material. As understood in the art, the memory cell may include additional layers. In some embodiments the memory cell 320 includes one or more additional AOxBOx contact layers.

As understood by those of skill in the art, the resistivity of the memory layer material is dependent on the concentration of oxygen ions or vacancies therein. Therefore, memory cell 320 functions as a rewritable memory cell, where the state of the memory cell 320 corresponds with the resistivity of the memory layer material. The memory layer material is written by applying a voltage to induce an electric field to force the concentration of the oxygen ions or vacancies to a desired concentration state, and the desired concentration state corresponds with a desired resistivity state. As a result, the resistance of the memory layer material is programmed by the write operation. To read the state of the memory cell, a voltage or a current may be applied to the memory cell 320. A current or voltage generated in response to the applied voltage or current is dependent on the resistance state of the memory cell material, and may be sensed to determine the resistance state.

In alternative embodiments, drain plug contact 325 is omitted. In such embodiments, AOxBOx contact structure 350 forms a contact with the drain 322. The contact between AOxBOx contact structure 350 and the drain 322 may be ohmic. In some embodiments, drain contact 325 is formed of an oxide material, such as a semiconductor oxide material.

Accordingly, in some embodiments, AOxBOx contact structures may be used for ohmic contacts to source and drain contacts for an oxide semiconductor transistor. Additionally or alternatively, a AOxBOx contact structure may be used to create a Schottky diode gate contact for the oxide semiconductor transistor. The Schottky barrier contact may form a Schottky diode having a polarity or orientation such that a voltage placed across the AOxBOx contact structure and source which causes the channel to conduct also causes the Schottky diode to be reversed biased. The Schottky barrier contact may have property similar or identical to those Schottky barriers and Schottky diodes discussed elsewhere herein.

The memory cell 320 of access device 310 is connected to a conductor 362 by a first AOxBOx contact structure 360. Conductor 362 may comprise any conductive material listed herein or as understood by those of skill in the art. AOxBOx contact structure 360 may have any of the properties of the AOxBOx materials discussed elsewhere herein. AOxBOx contact structure 360 may form an ohmic contact with the source plug contact 325 connected thereto. Additionally or alternatively, AOxBOx contact structure 360 may form an ohmic contact with the conductor 362.

Figure 4:
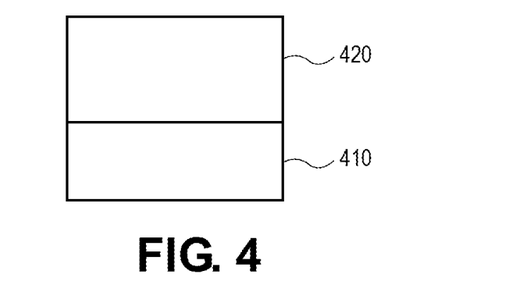
FIG. 4 is a schematic diagram of a Schottky contact between an oxide and a conductive amorphous oxide material.

FIG. 4 is a schematic diagram of a Schottky contact between a material 420 and a conductive amorphous AOx- BOx material 410. The contact between material 420 and AOxBOx material 410 forms a Schottky barrier contact having properties of Schottky barriers or diodes, as understood by those of skill in the art. The Schottky barrier may, for example, have a barrier height of between about 0.3 eV and about 2.5 eV. In some embodiments, the barrier height may be greater than or less than this range.

FIG. 4 illustrates an embodiment of a particular application of a contact formed with AOxBOx materials. Numerous other applications are also contemplated. Some, but not all of these other applications are discussed elsewhere herein.

For example, the Schottky contact may have current vs. voltage properties identifiable by one of skill in the art as being characteristic of a Schottky contact. For example, the Schottky contact may be rectifying. The Schottky contact may have low resistivity for current flowing from anode to cathode. The contact, may, for example, be identified as being Schottky by one of skill in the art as having a Schottky barrier as a result of parameters of the material 420 and AOxBOx material 410, such as Fermi level and Fermi level pinning, as understood by those of skill in the art.

The material 420 may, for example, comprise any of the materials discussed above with reference to material 120. The material 420 may have properties and characteristics similar or identical to material 120, discussed above.

The AOxBOx material 410 may have any of the properties of the AOxBOx materials discussed elsewhere herein.

In any embodiment or application, a noble metal layer may be formed between the material 420 and the AOxBOx material 410. In such embodiments or applications, the material 420/noble metal/AOxBOx material 410 stack effectively forms a Schottky barrier. In some embodiments, the Schottky barrier is formed between the noble metal and the AOxBOx material 410.

Figure 5:
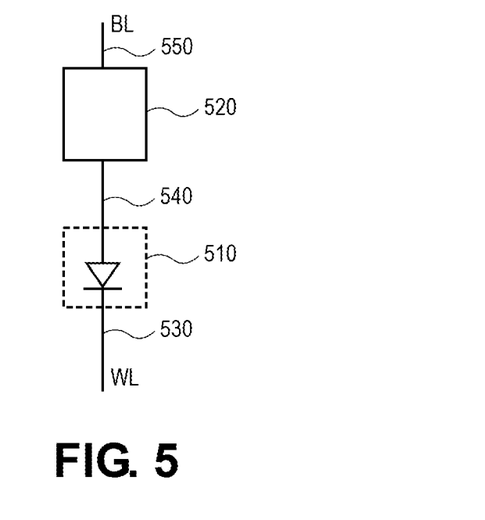
FIG. 5 is a schematic diagram of an access device connected to a memory cell.

FIG. 5 is a schematic diagram of an access device 510 connected to a memory cell 520 of a memory device. Memory cell 520 may, for example, be a unipolar device, for example, where set and reset operations are performed with the same voltage polarity across the memory cell 520. In this embodiment, access device 510 comprises a diode. FIG. 5 illustrates an embodiment of a particular application of a contact formed with AOxBOx materials. Numerous other applications are also contemplated. Some, but not all of these other applications are discussed elsewhere herein.

In this embodiment, access device 510 is connected to a word line of the memory device by a first AOxBOx contact structure 530, and is connected to the memory cell 520 by a second AOxBOx contact structure 540. In addition, the memory cell 520 is connected to a bit line of the memory device by a third AOxBOx contact structure 550.

Figure 6:
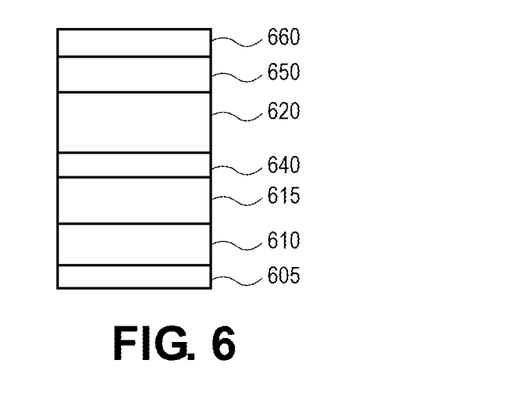
FIG. 6 is a schematic diagram of an access device connected to a memory cell.

FIG. 6 is a schematic cross-sectional diagram of a memory cell 620 connected to a diode access device, for example, such as access device 510 of FIG. 5. The diode access device includes first AOxBOx contact structure 610 and material 615. The diode access device includes a Schottky contact between material 615 and AOxBOx contact structure 610.

FIG. 6 illustrates an embodiment of a particular application of a contact formed with AOxBOx materials. Numerous other applications are also contemplated. Some, but not all of these other applications are discussed elsewhere herein.

Material 615 may have characteristics similar or identical any of the characteristics of material 120, discussed above with reference to FIG. 1. First AOxBOx contact structure 610 may have any of the properties of the AOxBOx materials discussed elsewhere herein.

The first AOxBOx contact structure 610 of the diode access device is connected to a word line conductor 605 of the memory device. The AOxBOx contact structure 610 and word line conductor 605 may form an ohmic contact. Word line conductor 605 may comprise any conductive material listed herein or as understood by those of skill in the art, and may function as a word line in the memory device as understood by those of skill in the art.

The AOxBOx contact structure 610 of the diode access device is also connected to material 615 and forms a Schottky diode therewith. In this embodiment, the cathode of the Schottky diode is formed by the AOxBOx contact structure 610, and the anode of the Schottky diode is formed by the material 615.

Material 615 of the diode access device is also connected to the memory cell 620 by a second AOxBOx contact structure 640. Second AOxBOx contact structure 640 may have any of the properties of the AOxBOx materials discussed elsewhere herein. Second AOxBOx contact structure 640 may form an ohmic contact with material 615. Second AOxBOx contact structure 640 may also form an ohmic contact with the memory cell 620.

In alternative embodiments, second AOxBOx contact structure 640 forms a Schottky contact with the memory cell 620, where the cathode of the resulting Schottky diode is formed by the second AOxBOx contact structure 640, and the anode of the Schottky diode is formed by the memory cell 620, or a portion of the memory cell 620 contacting the second AOxBOx contact structure 640. In such embodiments, the first AOxBOx contact structure 610, and the material 615 may be omitted. In addition, in such embodiments, second AOxBOx contact structure 640 may form an ohmic contact with the word line conductor 605.

Memory cell 620 may comprise a memory layer material, such as PCMO, or another memory layer material and an electrode layer, as understood by those of skill in the art. The electrode layer may, for example, comprise tungsten, and may cooperatively form a metal oxide heterojunction memory with the memory layer material. The electrode layer may be configured to accept or donate oxygen ions or vacancies from or to memory layer material in response to an electric field applied across the electrode layer and the memory layer material. In some embodiments, the electrode layer may be oxygen-rich and may cooperatively form an oxygen ion heterojunction memory cell with memory layer material. In alternative embodiments, the electrode layer may be oxygen depleted and may cooperatively form an oxygen vacancy heterojunction memory cell with the memory layer material. As understood in the art, the memory cell may include additional layers. In some embodiments the memory cell 620 includes one or more additional AOxBOx contact layers.

As understood by those of skill in the art, the resistivity of the memory layer material is dependent on the concentration of oxygen ions or vacancies therein. Therefore, memory cell 620 functions as a rewritable memory cell, where the state of the memory cell 620 corresponds with the resistivity of the memory layer material. The memory layer material is written by applying a voltage to induce an electric field to force the concentration of the oxygen ions or vacancies to a desired concentration state, and the desired concentration state corresponds with a desired resistivity state. As a result, the resistance of the memory layer material is programmed by the write operation. To read the state of the memory cell, a voltage or a current may be applied to the memory cell 620. A current or voltage generated in response to the applied voltage or current is dependent on the resistance state of the memory cell material, and may be sensed to determine the resistance state.

The memory cell 620 is connected to a bit line conductor 660 of the memory device by a third AOxBOx contact structure 650. Third AOxBOx contact structure 650 may have any of the properties of the AOxBOx materials discussed elsewhere herein. Third AOxBOx contact structure 660 may form an ohmic contact with the memory cell 620. Third AOxBOx contact structure 650 may also form an ohmic contact with bit line conductor 660. Bit line conductor 660 may comprise any conductive material listed herein or as understood by those of skill in the art, and may function as a bit line in the memory device as understood by those of skill in the art.

Figure 7:
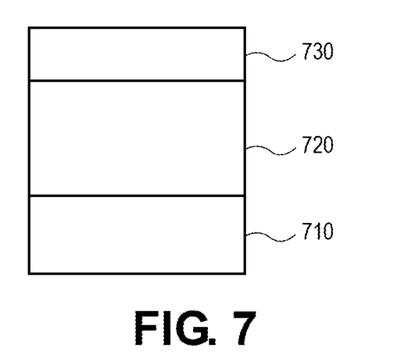
FIG. 7 is a schematic diagram of a double contact between an oxide and first and second conductive amorphous oxide materials.

FIG. 7 is a schematic cross-sectional diagram of a double contact between a material 720 and first and second conductive amorphous AOxBOx materials 710 and 730. The contact between material 720 and first AOxBOx material 710 may form a Schottky barrier contact having properties such as those discussed elsewhere herein. The contact between material 720 and first AOxBOx material 710 may form an ohmic having properties such as those discussed elsewhere herein. The contact between material 720 and second AOxBOx material 730 may form a Schottky barrier contact having properties such as those discussed elsewhere herein. The contact between material 720 and second AOxBOx material 730 may form an ohmic having properties such as those discussed elsewhere herein.

FIG. 7 illustrates an embodiment of a particular application of a contact formed with AOxBOx materials. Numerous other applications are also contemplated. Some, but not all of these other applications are discussed elsewhere herein.

The material 720 may, for example, comprise any of the materials discussed above with reference to material 120. The material 420 may have properties and characteristics similar or identical to material 120, discussed above.

The first and second AOxBOx materials 710 and 730 may have any of the properties of the AOxBOx materials discussed elsewhere herein. In some embodiments, the first and second AOxBOx materials 710 and 730 comprise the same AOxBOx material. In some embodiments, the first and second AOxBOx materials 710 and 730 comprise different AOxBOx materials.

In any embodiment or application, a noble metal layer may be formed between the material 720 and either of the AOxBOx materials 710 and 730.

Figure 8:
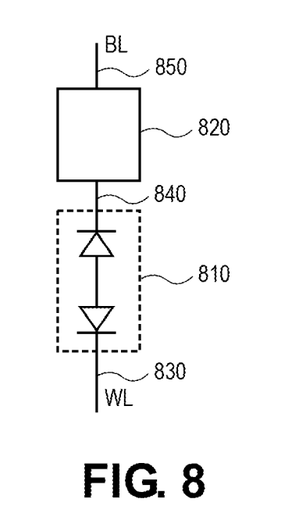
FIG. 8 is a schematic diagram of an access device connected to a memory cell.

FIG. 8 is a schematic diagram of an access device 810 connected to a memory cell 820 of a memory device. In this embodiment, access device 810 comprises back to back diodes. FIG. 8 illustrates an embodiment of a particular application of a contact formed with AOxBOx materials. Numerous other applications are also contemplated. Some, but not all of these other applications are discussed elsewhere herein.

In this embodiment, back to back diode access device 810 is connected to a word line of the memory device by a first AOxBOx contact structure 830, and is connected to the memory cell 820 by a second AOxBOx contact structure 840. In addition, the memory cell 820 is connected to a bit line of the memory device by a third AOxBOx contact structure 850.

Figure 9:
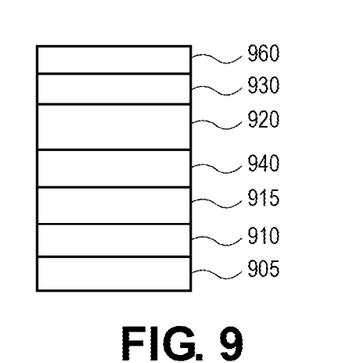
FIG. 9 is a schematic diagram of an access device connected to a memory cell.

FIG. 9 is a schematic cross-sectional diagram of a memory cell 920 connected to a back to back diode access device, for example, such as access device 810 of FIG. 8. The back to back diode access device includes first and second AOxBOx contact structures 910 and 930, and material 915. The back to back diode access device includes a first Schottky contact between material 915 and first AOxBOx contact structure 910 and a second Schottky contact between material 915 and second AOxBOx contact structure 930.

FIG. 9 illustrates an embodiment of a particular application of a contact formed with AOxBOx materials. Numerous other applications are also contemplated. Some, but not all of these other applications are discussed elsewhere herein.

Material 915 may have characteristics similar or identical any of the characteristics of material 120, discussed above with reference to FIG. 1. First and second AOxBOx contact structure 910 and 930 may have any of the properties of the AOxBOx materials discussed elsewhere herein.

The first AOxBOx contact structure 910 of the diode access device is connected to a word line conductor 905 of the memory device. The first AOxBOx contact structure 910 and word line conductor 905 may form an ohmic contact. Word line conductor 905 may comprise any conductive material listed herein or as understood by those of skill in the art, and may function as a word line in the memory device as understood by those of skill in the art.

The AOxBOx contact structure 910 of the diode access device is also connected to material 915 and forms a first Schottky contact of a first Schottky diode. In this embodiment, the cathode of the first Schottky diode is formed by the first AOxBOx contact structure 910, and the anode of the first Schottky diode is formed by the material 915.

The material 915 of the diode access device is also connected to the memory cell 920 by a second AOxBOx contact structure 940. Second AOxBOx contact structure 940 may have any of the properties of the AOxBOx materials discussed elsewhere herein. Second AOxBOx contact structure 940 may form an second Schottky contact with material 915. In this embodiment, the cathode of the first Schottky diode is formed by the second AOxBOx contact structure 940, and the anode of the second Schottky diode is formed by the material 915.

In alternative embodiments, second AOxBOx contact structure 940 forms a Schottky contact with the memory cell 920, where the anode of the resulting Schottky diode is formed by the second AOxBOx contact structure 940, and the cathode of the Schottky diode is formed by the memory cell 920, or a portion of the memory cell 920 contacting the second AOxBOx contact structure 940. In such embodiments, the first AOxBOx contact structure 910, and the material 915 may be omitted. In addition, in such embodiments, second AOxBOx contact structure 640 may form a Schottky contact with the word line conductor 905, where the anode of the resulting Schottky diode is formed by the second AOxBOx contact structure 940, and the cathode of the Schottky diode is formed by the word line conductor 905.

Memory cell 920 may comprise a memory layer material, such as PCMO, or another memory layer material and an electrode layer, as understood by those of skill in the art. The electrode layer may, for example, comprise tungsten, and may cooperatively form a metal oxide heterojunction memory with the memory layer material. The electrode layer may be configured to accept or donate oxygen ions or vacancies from or to memory layer material in response to an electric field applied across the electrode layer and the memory layer material. In some embodiments, the electrode layer may be oxygen-rich and may cooperatively form an oxygen ion heterojunction memory cell with memory layer material. In alternative embodiments, the electrode layer may be oxygen depleted and may cooperatively form an oxygen vacancy heterojunction memory cell with the memory layer material. As understood in the art, the memory cell may include additional layers. In some embodiments the memory cell 920 includes one or more additional AOxBOx contact layers.

As understood by those of skill in the art, the resistivity of the memory layer material is dependent on the concentration of oxygen ions or vacancies therein. Therefore, memory cell 920 functions as a rewritable memory cell, where the state of the memory cell 920 corresponds with the resistivity of the memory layer material. The memory layer material is written by applying a voltage to induce an electric field to force the concentration of the oxygen ions or vacancies to a desired concentration state, and the desired concentration state corresponds with a desired resistivity state. As a result, the resistance of the memory layer material is programmed by the write operation. To read the state of the memory cell, a voltage or a current may be applied to the memory cell 920. A current or voltage generated in response to the applied voltage or current is dependent on the resistance state of the memory cell material, and may be sensed to determine the resistance state.

The memory cell 920 is connected to a bit line conductor 960 of the memory device by a third AOxBOx contact structure 950. Third AOxBOx contact structure 950 may have any of the properties of the AOxBOx materials discussed elsewhere herein. Third AOxBOx contact structure 960 may form an ohmic contact with the memory cell 920. Third AOxBOx contact structure 950 may also form an ohmic contact with bit line conductor 960. Bit line conductor 960 may comprise any conductive material listed herein or as understood by those of skill in the art, and may function as a bit line in the memory device as understood by those of skill in the art.

Figure 10:
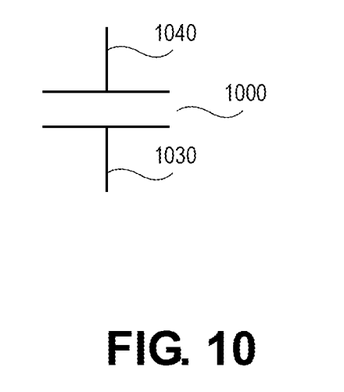
FIG. 10 is a schematic diagram of capacitor.

FIG. 10 is a schematic diagram of capacitor 1000 formed by a double contact between a material and first and second conductive amorphous AOxBOx materials. FIG. 10 illustrates an embodiment of a particular application of a contact formed with AOxBOx materials. Numerous other applications are also contemplated. Some, but not all of these other applications are discussed elsewhere herein.

In this embodiment, capacitor 1000 is connected to a first conductor of a device by a first AOxBOx contact structure 1030, and is connected to a second conductor of the device by a second AOxBOx contact structure 1040.

Figure 11:
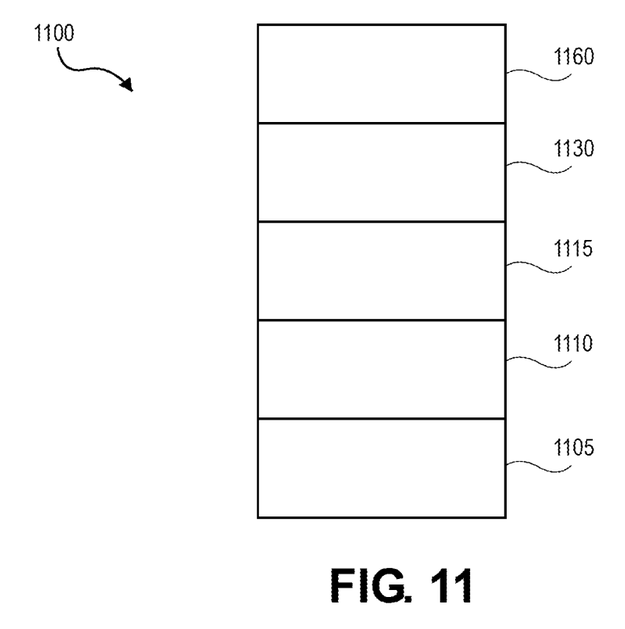
FIG. 11 is a schematic cross-sectional diagram of a capacitor.

FIG. 11 is a schematic cross-sectional diagram of a capacitor 1100, such as capacitor 1000 of FIG. 10. Capacitor 1000 includes first and second AOxBOx contact structures 1110 and 1130, and material 1115. The capacitor 1100 includes a first contact between material 1115 and first AOxBOx contact structure 1110 and a second contact between material 1115 and second AOxBOx contact structure 1130. Material 1115 may have characteristics similar or identical any of the characteristics of the insulative embodiments of material 120, discussed above with reference to FIG. 1. First and second AOxBOx contact structure 1110 and 1130 may have any of the properties of the AOxBOx materials discussed elsewhere herein.

FIG. 11 illustrates an embodiment of a particular application of a contact formed with AOxBOx materials. Numerous other applications are also contemplated. Some, but not all of these other applications are discussed elsewhere herein.

The first AOxBOx contact structure 1110 is connected to a conductor 1105 of a device. The first AOxBOx contact structure 1110 and conductor 1105 may form an ohmic contact.

The first AOxBOx contact structure 1110 is also connected to material 1115. In addition, material 1115 is connected to the second AOxBOx contact structure 1130. The first AOxBOx contact structure 1110/material 1115/second AOxBOx contact structure 1130 stack forms a two plate capacitor having capacitance properties resulting from, for example, the thickness and dielectric constant of material 1115.

In addition, the second AOxBOx contact structure 1130 is connected to a conductor 1160 of the device. The second AOxBOx contact structure 1130 and conductor 1160 may form an ohmic contact.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. An electronic device, comprising:
a conductor;
a conductive oxide material electrically connected to the conductor, wherein the conductive oxide material comprises first and second oxide materials, wherein the first oxide material comprises a noble metal and is conductive, and wherein the second oxide material comprises a transition metal and is insulative; and
a second material, electrically connected to the conductive oxide material.

2. The electronic device of claim 1, wherein the conductive oxide material is substantially nanocrystalline.

3. The electronic device of claim 2, wherein the first and second oxide materials each comprise crystal grains having a grain size less than about 10 nm.

4. The electronic device of claim 2, wherein the first oxide material has a first crystalline lattice structure and the second oxide material as a second crystalline lattice structure, wherein the first and second crystalline lattice structures are different.

5. The electronic device of claim 1, wherein the conductive oxide material has a diffusion constant of oxygen ions less than about $1 \times 10$-$10$ cm2/s.

6. The electronic device of claim 1, wherein the conductive oxide material does not donate oxygen ions to the second material, and wherein the conductive oxide material does not accept oxygen ions from the second material.

7. The electronic device of claim 1, wherein the conductive oxide material is substantially transparent.

8. The electronic device of claim 1, wherein the conductive oxide material and the second material form an ohmic contact therebetween.

9. The electronic device of claim 1, wherein the conductive oxide material and the second material form a Schottky contact therebetween.

10. The electronic device of claim 1, wherein the conductive oxide material and the conductor form an ohmic contact therebetween.

11. The electronic device of claim 1, wherein the conductive oxide material and the conductor form a Schottky contact therebetween.

12. The electronic device of claim 1, wherein the conductive oxide material and the second material at least partly form an access device of a memory cell.

13. A method of forming an electronic device, the method comprising:

connecting a conductive oxide material electrically to a conductor, wherein the conductive oxide material comprises first and second different oxide materials wherein the first oxide material comprises a noble metal and is conductive, and wherein the second oxide material comprises a transition metal and is insulative; and connecting a second material to the conductive oxide material.

14. The method of claim 13, wherein the conductive oxide material is substantially nanocrystalline.

15. The method of claim 14, wherein the first and second oxide materials each comprise crystal grains having a grain size less than about 10 nm.

16. The method of claim 14, wherein the first oxide material has a first crystalline lattice structure and the second oxide material as a second crystalline lattice structure, wherein the first and second crystalline lattice structures are different.

17. The method of claim 13, wherein the conductive oxide material has a diffusion constant of oxygen ions less than about $1 \times 10^{-10}$ cm2/s.

18. The method of claim 13, wherein the conductive oxide material does not donate oxygen ions to the second material, and wherein the conductive oxide material does not accept oxygen ions from the second material.

19. The method of claim 13, wherein the conductive oxide material is substantially transparent.

20. The method of claim 13, wherein the conductive oxide material and the second material form an ohmic contact therebetween.

21. The method of claim 13, wherein the conductive oxide material and the second material form a Schottky contact therebetween.

22. The method of claim 13, wherein the conductive oxide material and the conductor form an ohmic contact therebetween.

23. The method of claim 13, wherein the conductive oxide material and the conductor form a Schottky contact therebetween.

24. The method of claim 13, wherein the conductive oxide material and the second material at least partly form an access device of a memory cell.

* * * * *